(12) United States Patent
Li et al.

(10) Patent No.: US 12,236,066 B2
(45) Date of Patent: Feb. 25, 2025

(54) ELECTRONIC DEVICES WITH STRAIN GAUGES AND LIGHT SOURCES

(71) Applicant: Apple Inc., Cupertino, CA (US)

(72) Inventors: Zhengyu Li, Shanghai (CN); Ming Gao, Shanghai (CN); Wenhao Wang, Shanghai (CN); Yuanzhen Fan, Shanghai (CN)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/354,361

(22) Filed: Jul. 18, 2023

(65) Prior Publication Data
US 2024/0094881 A1    Mar. 21, 2024

Related U.S. Application Data

(60) Provisional application No. 63/408,002, filed on Sep. 19, 2022.

(51) Int. Cl.
*G06F 3/04842* (2022.01)
*G01L 1/26* (2006.01)
*G06F 3/04817* (2022.01)
*G06F 3/147* (2006.01)
*G06F 3/16* (2006.01)

(52) U.S. Cl.
CPC ............ *G06F 3/04842* (2013.01); *G01L 1/26* (2013.01); *G06F 3/04817* (2013.01); *G06F 3/147* (2013.01); *G06F 3/165* (2013.01); *G06F 3/167* (2013.01)

(58) Field of Classification Search
CPC .. G06F 3/04842; G06F 3/04817; G06F 3/147; G06F 3/165; G06F 3/167; G01L 1/26
See application file for complete search history.

(56) References Cited

U.S. PATENT DOCUMENTS

| | | | |
|---|---|---|---|
| 8,334,838 B2 | 12/2012 | Sadahiro | |
| 8,577,076 B2 | 11/2013 | Ohashi et al. | |
| 9,874,965 B2 | 1/2018 | Pedder et al. | |
| 10,484,793 B1* | 11/2019 | Peterson | H04R 3/12 |
| 10,595,618 B2 | 3/2020 | Wang et al. | |
| 11,079,875 B2 | 8/2021 | Wodrich et al. | |
| 11,137,861 B2 | 10/2021 | Li et al. | |
| 11,150,692 B2 | 10/2021 | Wang et al. | |
| 11,255,028 B2* | 2/2022 | Podhajny | D03D 1/0088 |
| 11,281,305 B2 | 3/2022 | Wang et al. | |
| 11,436,964 B1* | 9/2022 | Wang | G09G 3/20 |
| 11,460,169 B1* | 10/2022 | Liu | F21V 33/0056 |
| 11,536,446 B2* | 12/2022 | Liu | H03K 17/9622 |
| 11,601,756 B2* | 3/2023 | Peterson | H04R 1/1041 |

(Continued)

FOREIGN PATENT DOCUMENTS

EP    3511146 A2    7/2019

*Primary Examiner* — Tadesse Hailu
(74) *Attorney, Agent, or Firm* — Treyz Law Group, P.C.; Tianyi He (57) ABSTRACT

An electronic device such as a voice-controlled speaker may have an array of strain gauges and light-emitting diodes. The light-emitting diodes may be configured to display dynamically adjustable button icons overlapping the strain gauges. Force measurements from the strain gauges may be used to adjust speaker output and other device operations.

20 Claims, 6 Drawing Sheets (56) References Cited

U.S. PATENT DOCUMENTS

| | | | |
|---|---|---|---|
| 11,768,376 B1* | 9/2023 | Pedder | G02B 27/0179 |
| | | | 345/694 |
| 11,838,709 B1* | 12/2023 | Griffin, II | H04R 1/023 |
| 11,930,420 B1* | 3/2024 | Persson | H04W 4/02 |
| 2007/0223736 A1* | 9/2007 | Stenmark | H03G 5/005 |
| | | | 381/103 |
| 2013/0154998 A1* | 6/2013 | Yang | G06F 3/047 |
| | | | 345/174 |
| 2016/0209972 A1* | 7/2016 | Yang | H04M 1/72469 |
| 2017/0030784 A1* | 2/2017 | Mason | G01L 5/0047 |
| 2018/0275001 A1* | 9/2018 | Tokuda | G01L 9/06 |
| 2019/0035567 A1 | 1/2019 | O'Keeffe | |
| 2020/0037077 A1* | 1/2020 | Peterson | G06F 3/044 |
| 2020/0356139 A1 | 11/2020 | Bushnell et al. | |
| 2021/0064167 A1* | 3/2021 | Hsu | G06F 1/182 |
| 2021/0072857 A1* | 3/2021 | Zhao | G06F 3/0414 |
| 2022/0007095 A1* | 1/2022 | Sunshine | H04R 5/02 |
| 2022/0011905 A1 | 1/2022 | Li et al. | |

\* cited by examiner

ELECTRONIC DEVICES WITH STRAIN GAUGES AND LIGHT SOURCES

This application claims the benefit of provisional patent application No. 63/408,002, filed Sep. 19, 2022, which is hereby incorporated by reference herein in its entirety.

FIELD

This relates generally to electronic devices and, more particularly, to electronic devices with speakers.

BACKGROUND

Electronic devices may include input-output components. For example, voice-controlled devices may have microphones for gathering voice input and speakers for providing audio output.

SUMMARY

An electronic device such as a voice-controlled speaker may have an array of strain gauges and light-emitting diodes. The light-emitting diodes may be configured to display dynamically adjustable button icons at locations that overlap the strain gauges. The button icons may, for example, have the shapes of media playback controls.

The strain gauges may measure applied force to the button icons. Force measurements from the strain gauges may be used to adjust speaker output and other device operations. For example, speaker volume and other device operating parameters may be adjusted by comparing force measurements to a threshold, may be adjusted in linear proportion to force measurements, and/or may be adjusted in non-linear proportion to force measurements.

DETAILED DESCRIPTION

Figure 1:
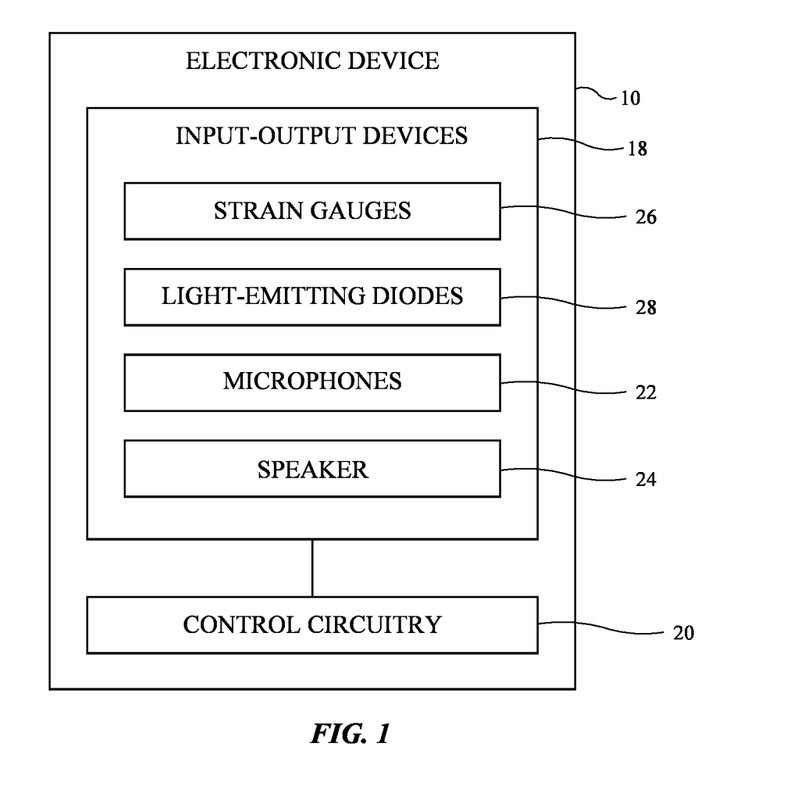
FIG. 1 is a schematic diagram of an illustrative electronic device in accordance with an embodiment.

FIG. 1 is a schematic diagram of an illustrative electronic device. Electronic device 10 may be an electronic device such as a voice-controlled electronic device (sometimes referred to as a digital assistant or voice-controlled speaker), a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which device 10 is mounted in a kiosk, in an automobile, airplane, or other vehicle, other electronic equipment, or equipment that implements the functionality of two or more of these devices. If desired, device 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, shirt, pants, shoes, etc.), or may be any other suitable electronic device. In an illustrative configuration, which is described herein as an example, electronic device 10 is a voice-controlled electronic device such as a voice-controlled speaker with internet access.

As shown in FIG. 1, device 10 may include input-output devices 18 and control circuitry 20. Control circuitry 20 may include microprocessors, microcontrollers, application-specific integrated-circuits, digital signal processors, baseband processors, and/or other controllers and may include storage such as random-access memory, read-only memory, solid state drives, and/or other storage and processing circuitry.

Control circuitry 20 may gather information from sensors and other circuitry in input-output devices 18 and may use input-output devices 18 to supply output. Input-output devices 18 may, for example, include audio devices such as microphones 22 and speakers 24. Microphones 22 can gather audio input such as voice commands. Speakers 24 can produce audio output (e.g., sound such as music, synthesized voice, tones, etc.).

Device 10 may have input devices such as strain gauges 26 or other force sensors to gather force input. The strain gauges may be arranged in an array that covers some or all of the surface of device 10. A user may provide force input to the strain gauges by pressing on one or more areas on the surface of device 10.

Light sources such as semiconductor lasers or light-emitting diodes 28 may be provided in an array that covers some or all of the surface of device 10. Diodes 28 may have one or more colors (e.g., diodes 28 may include white light-emitting diodes, red light-emitting diodes, green light-emitting diodes, blue light-emitting diodes, and/or light-emitting diodes of other colors). During operation, light-emitting diodes 28 may be used to supply steady and/or flashing visual output such as text, icons, and/or other graphical elements. If desired, light-emitting diodes 28 may produce dynamically adjustable button icons and moving light patterns (e.g., chasing light effects that progress around the perimeter of device 10 and/or that otherwise move across the surface of device 10).

If desired, input-output devices 18 may include other components for gathering input and providing output. For example, devices 18 may include buttons for gathering button press input, touch sensors for gathering touch sensor input, capacitive sensors, optical sensors, proximity sensors, temperature sensors, moisture sensors, gas sensors pressure sensors, magnetic sensors, position and orientation sensors (e.g., accelerometers, gyroscopes, and/or compasses), and/or other sensors. Displays may be used in supply visual output to a user. Haptic output devices such as vibrators may provide haptic output. Wireless circuitry in circuitry 20 (e.g., wireless local area network circuitry, cellular telephone circuitry, etc.) may be used to support wireless communications with external equipment.

Figure 2:
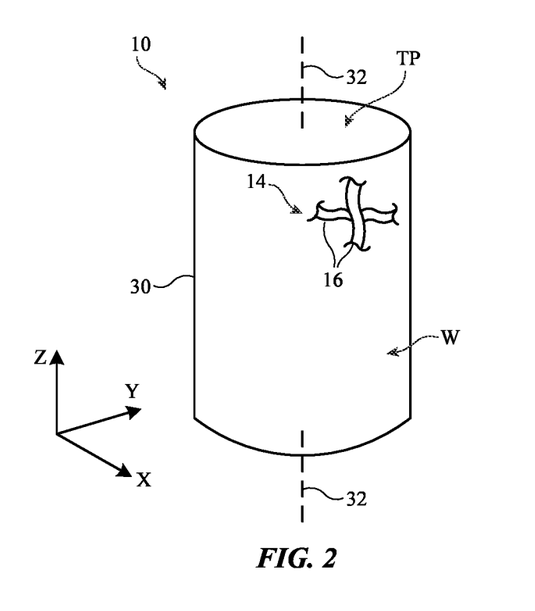
FIGS. 2 and 3 are perspective views of illustrative electronic devices in accordance with embodiments.
Figure 3:
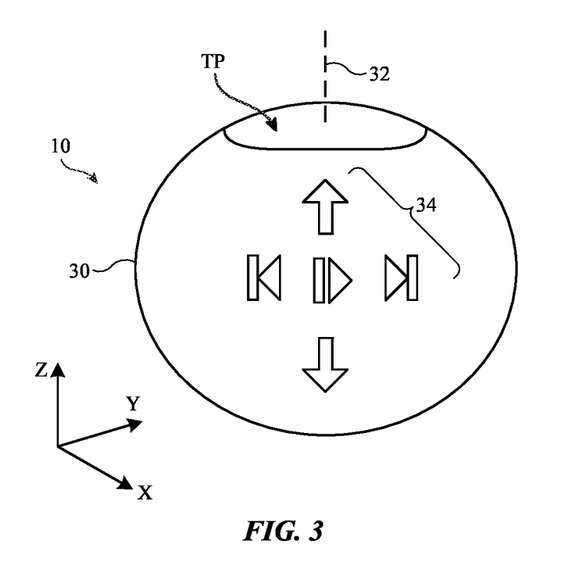

Electronic device 10 may have housings of any suitable shape. FIGS. 2 and 3 are perspective views of illustrative electronic devices. In the example of FIG. 2, device 10 has cylindrical housing 30. Housing 30 has a cylindrical shape in which housing sidewall W wraps around longitudinal (vertical) axis 32 and upper (top) housing portion TP forms a circular or dome-shaped upper housing surface. In the example of FIG. 3, housing 30 of device 10 has a spherical shape with a top portion (portion TP) that has a planar or domed shape. In the examples of FIGS. 2 and 3, housing 30 exhibits rotational symmetry about vertical axis 32. Other housing shapes may be used, if desired (e.g., device 10 may have a housing with planar sidewalls, curved sidewalls, a pyramidal shape, a rectangular box shape, a conical shape, and/or other housing shapes).

Input-output devices 18 and circuitry 20 may be mounted in the interior of housing 30. In some embodiments, electrical components (e.g., integrated circuits and other circuits) may be mounted on a printed circuit under housing portion TP. Housing 30 may have one or more portions that are transparent to sound and light. For example, housing 30 of FIG. 2 and/or housing 30 of FIG. 3 may be covered by a layer of light-transmitting and sound-transmitting fabric (see, e.g., fabric 14 of FIG. 2).

Fabric 14 may include intertwined strands of material such as strands 16. Fabric 14 may, for example, include warp knit fabric that is formed by warp knitting strands 16 and/or may include woven fabric, fabric with braided strands of material, etc. Strands 16 may be single-filament strands (sometimes referred to as fibers or monofilaments) or may be strands of material formed by intertwining multiple monofilaments of material together (sometimes referred to as yarns). Strands 16 may be formed from polymer, metal, glass, graphite, ceramic, magnetic materials, natural materials such as cotton or bamboo, or other organic and/or inorganic materials and combinations of these materials.

Fabric 14 or other sound-transparent and light-transparent material may have openings that allow at least some sound and light to pass. This allows fabric 14 to cover optical and audio components (e.g., light sources such as light-emitting diodes 28, microphones 22, speaker 24, etc.). Fabric 14 or other sound-transparent and light-transparent layer of material that covers device 10 may also exhibit sufficient flexibility to allow force from a user's fingers or other external object to deform the layer inwardly so that overlapped strain gauge sensor circuitry can detect applied force.

During operation, light-emitting diodes 28 may be used to create visible text, icons, and/or other illuminated visual content on the exterior of device 10. As shown in FIG. 3, for example, light-emitting diodes 28 may be used to create illuminated patterned output 34 (sometimes referred to as light output or patterned light). Output 34 may include text (e.g., song titles, weather information, message content, and/or other words), may include graphics (e.g., icons), and/or other output. In the example of FIG. 3, output 34 includes dynamically adjustable button icons (e.g., illuminated patterns representing a forward button, a reverse button, an up button, a down button, and a pause/play button). These icons may each serve to identify the location of a respective button and may each overlap a respective strain gauge or set of strain gauges that monitors for force input to that button. During operation of device 10, the size, shape, color, location and/or other attributes of the button icons can be adjusted (e.g., depending on the type of media playback operations being controlled, depending on the time of day, depending on user preferences, depending on the detected location of a user of device 10 relative to device 10, and/or depending on other factors).

The buttons of output 34 may include button icons of one or more different colors. Different colors may, as an example, be used to indicate different button function and/or may be used to indicate which button options are currently available. Buttons may also be lit up or turned off depending on context. As an example, up and down buttons (e.g., up and down arrows or other volume adjustment buttons) may be used to increase or decrease media playback volume and may be selectively presented when media tracks are being played by device 10 (and may be hidden when the media tracks are not being played). Strain gauges 26 that are overlapped by output 34 (and, if desired, strain gauges 26 that are not overlapped by output 34) may be used to gather input to control the operation of device 10. For example, one or more strain gauges 26 that are overlapped by a button icon may be used to gather force input associated with that button icon.

Figure 4:
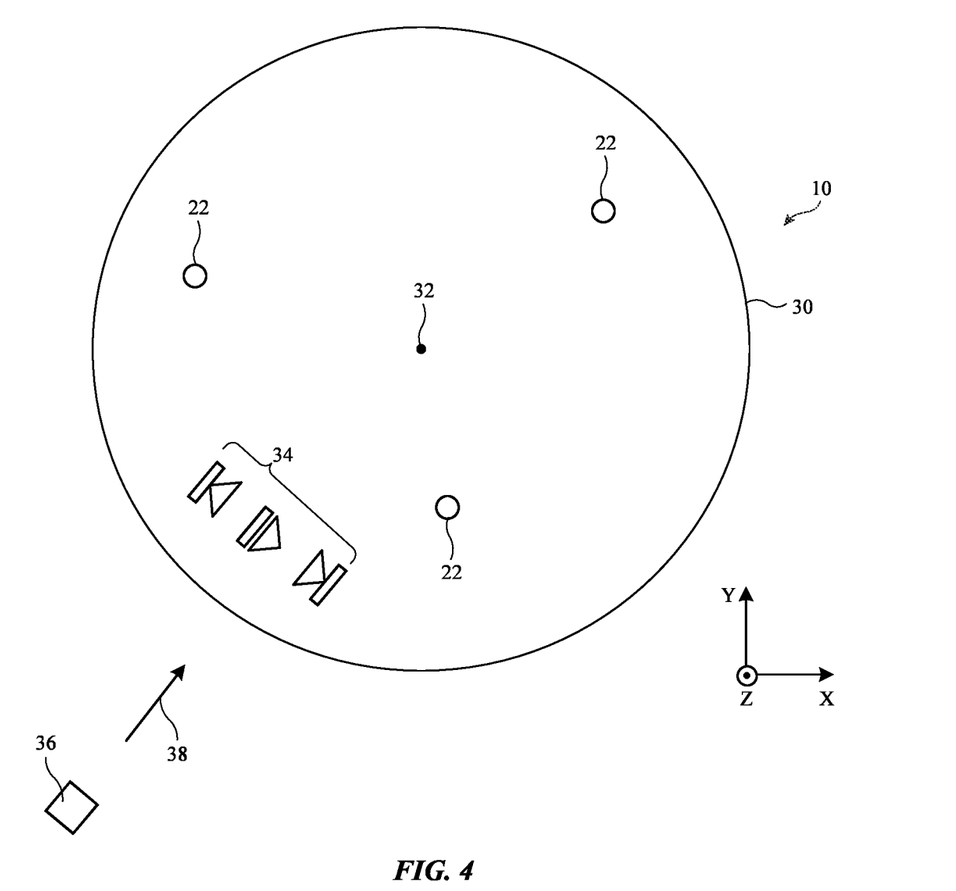
FIG. 4 is a top view of an illustrative electronic device in accordance with an embodiment.

If desired, the location at which output 34 (e.g., a set of media playback control buttons or other button icons) is presented on the exterior surface of housing 30 may be adjusted dynamically based on user location. Consider, as an example, the top view of device 10 of FIG. 4. In this example, housing 30 has a shape that is rotationally symmetric about axis 32. Output 34 (e.g., a set of reconfigurable buttons) may be presented on housing 30. When a user presses on a given illuminated button icon, one or more strain gages under the pressed location may detect the button press input, so that device 10 may take appropriate action in response (e.g., by adjusting playback volume, by changing tracks, by playing or pausing, etc.). Microphones 22 may be located on different sides of device 10. By processing sound measurements with microphones 22, microphones 22 can be used to detect the direction from which voice commands or other sound is being provided to device 10. As an example, if a user or other sound source such as sound source 36 of FIG. 4 produces sound in direction 38, microphones 22 can use triangulation to determine this direction and can move output 34 accordingly. As shown in FIG. 4, for example, buttons in output 34 may be configured to face direction 38. In this way, a user who is providing voice commands to device 10 may be provided with output 34 that is visible to the user, even if the user changes position relative to device 10 over time.

Figure 5:
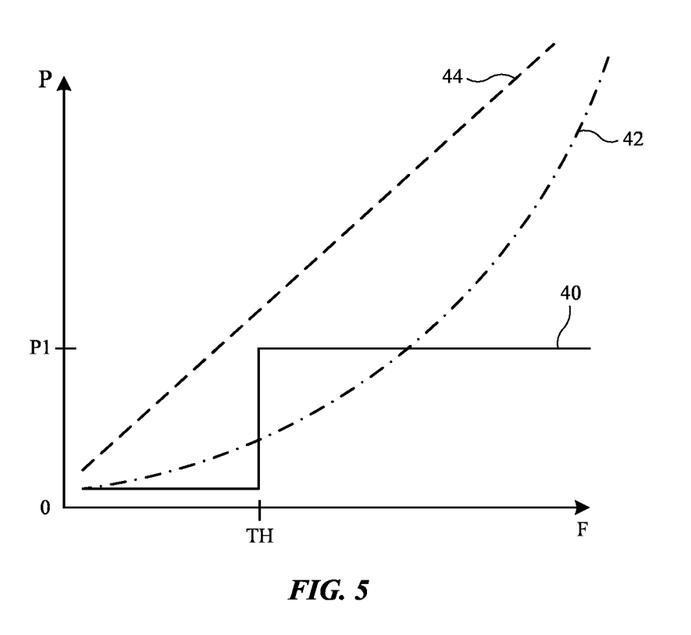
FIG. 5 is a graph showing how an operating parameter for an illustrative electronic device may be adjusted as a function of applied force to a strain gauge in accordance with an embodiment.

FIG. 5 is a graph showing how force input to one or more of strain gauges 26 may be used to adjust device operations. In the graph of FIG. 5, the value of an adjustable device operating parameter P has been plotted as a function of the amount of force F measured by a strain gauge 26 (e.g., measured finger pressure which may be applied, as an example, to an illuminated button pattern overlapping the strain gauge). Parameter P may correspond to an output volume level for speaker 24 (sometimes referred to as a media playback volume), may corresponding to a brightness level for light-emitting diodes 28, may correspond to the brightness value of a ceiling lamp or other external lighting device that is being wirelessly controlled using device 10, may correspond to a fast-forward or rewind speed during media playback operations, and/or may correspond to any other adjustable parameter associated with the operation of device 10.

As shown by illustrative curve 40, device 10 may process applied force F in a binary fashion. With this type of arrangement, parameter P may have a first value (e.g., 0) when measured force F is less than a predetermined threshold TH and may have a second value (e.g., P1) when measured force F is more than the predetermined threshold TH. If, as an example, parameter P corresponds to speaker output volume for speaker 24, the speaker may be off (no sound output) unless the measured value of F exceeds threshold TH, in which case the speaker may produce sound at a volume associated with value P1.

As shown by curve 44, applied force F may be linearly mapped to a corresponding value of parameter P. With this type of arrangement, parameter P may have a larger value when measured force F is larger and may have a linearly proportional smaller value when measured force F is smaller. If, as an example, parameter P corresponds to speaker output volume, strong input to strain gauge 26 will result in a loud sound output and weak input to strain gauge 26 will result in a soft sound output.

Curve 42 illustrates how there may be a non-linear relationship between input force F and the resulting adjusted value of parameter P. If desired, the value of P may also change (in a binary fashion, linearly, and/or non-linearly) as a function of time. If, as an example, force F exceeds threshold TH for five seconds, output volume may be increased more than if force F only exceeds threshold TH for one second.

Combinations of these approaches may also be used. For example, the value of P may be ramped up as a function of the amount of time that force F is applied and, during this ramp-up process, may ramp up more quickly when force F is large than when force F is small.

Figure 6:
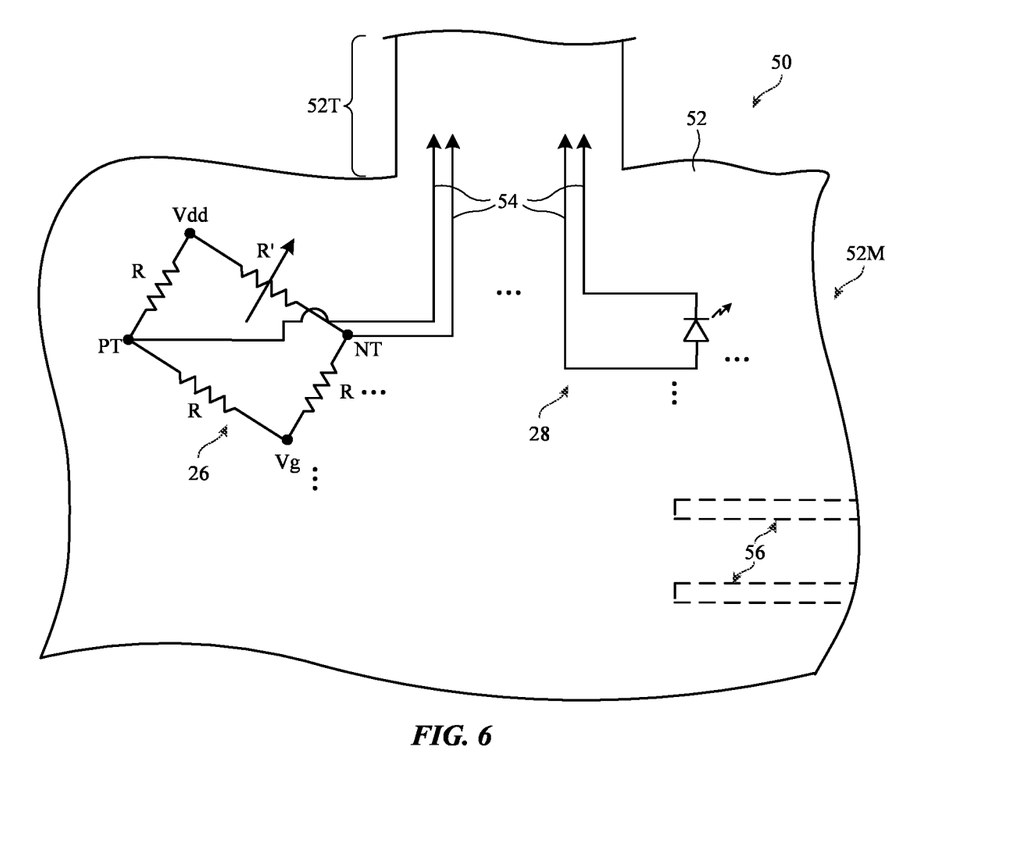
FIG. 6 is a top view of an illustrative flexible substrate with an array of strain gauges for gathering user input and an overlapping array of light sources for providing light output in accordance with an embodiment.

FIG. 6 is a top view of an illustrative array of strain gauges 26 and light-emitting diodes 28. As shown in FIG. 6, strain gauges 26 and light-emitting diodes 28 may be organized in an array such as array 50 in which numerous strain gauges 26 and numerous light-emitting diodes 28 are mounted across the surface of substrate 52 (e.g., tens or hundreds of strain gauges 26 and/or tens or hundreds of light-emitting diodes 28 or more). In an illustrative configuration, array 50 contains multiple rows and columns of strain gauges 26 interspersed with multiple rows and columns of light-emitting diodes 28. Strain gauges 26 and diodes 28 may have the same pitch or the density (number per unit surface area) of strain gauges 26 may be smaller or larger than the density of diodes 28. With mounting arrangements of the type shown in FIG. 6, there is an array of light-emitting diodes 28 on substrate 52 that effectively overlaps and merges with an array of strain gauges 26 on substrate 52. Substrate 52 may extend over some or all of the area of housing 30 and may be covered with a light-transparent and sound-transparent cover layer (e.g., a fabric layer).

Substrate 52 may be formed from a flexible dielectric material such as flexible polymer (e.g., polyethylene terephthalate, silicone, polyimide, etc.). To enhance the flexibility of substrate 52 and thereby enhance the ability of substrate 52 to conform to curved surfaces of housing 30, substrate 52 may optionally be provided with relief cuts 56 (e.g., to form strips of substrate 52 to form an array of openings to enhance substrate flexibility, etc.). If desired, substrate 52 may have a main portion 52M on which strain gauges 26 and light-emitting diodes 28 are mounted and may have an optional narrow tail portion such as tail 52T that helps route conductive lines 54 to control circuitry 20 (e.g., a printed circuit located in top portion TP). During operation, lines 54 may be used to convey strain gauges measurements from strain gauges 26 to control circuitry 20 (e.g., a printed circuit under upper portion TP) and may be used to convey drive currents (also called control signals) from control circuitry 20 to light-emitting diodes 28.

Each strain gauge 26 may have a bridge circuit formed from resistors R. Each strain gauge bridge circuit may receive a positive voltage at power supply terminal Vdd and a ground voltage at ground terminal Vg. Resistors R may include at least one force-sensitive resistor R' that exhibits a resistance that varies as a function of applied force from a user's finger or other external object. Force-sensitive resistor R' may be formed from a resistive ink such as an organic resistive ink that is printed over metal traces on substrate 52. During operation, the output of each strain gauge is measured by monitoring the voltage across the output terminals PT and NT in the strain gauge bridge circuit.

Figure 7:
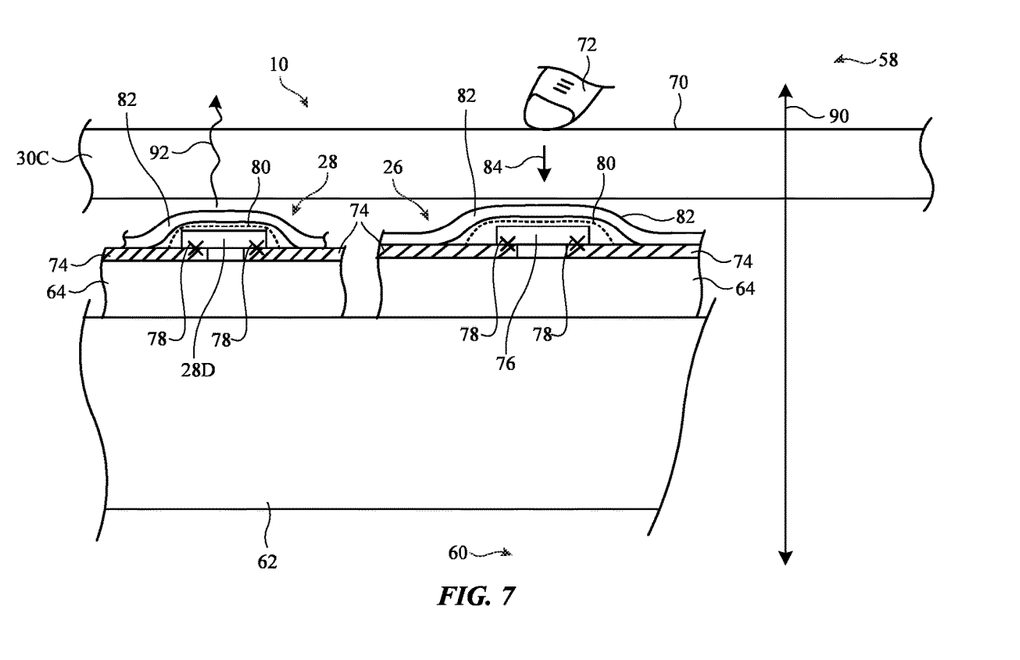
FIG. 7 is a cross-sectional side view of an illustrative electronic device showing how force input may be gathered through a housing cover layer and how light output may be supplied through the housing cover layer in accordance with an embodiment.

FIG. 7 is a cross-sectional side view of an illustrative array of strain gauges 26 and light-emitting diodes 28 in device 10. As shown in FIG. 7, device 10 may have an internal support structure such as support 62 (e.g., a supporting layer, a shell, a frame, and/or other support structure). Flexible substrate 64 may be supported on support 62 and may be overlapped by cover layer 30C. Support 62, substrate 64, and cover 30C separate interior region 60 in the interior of device 10 from exterior region 58 surrounding device 10.

Flexible substrate 64, which may be supported on the outer surface of support 62 may contain signal lines (see, e.g., lines 54 of FIG. 6) formed from metal traces 74. In each strain gauge 26, a strain gauge resistor 76 is electrically coupled across traces 74 at electrical connections 78. Encapsulation may be provided to help hermetically seal resistor 76. This encapsulation may be formed using cured liquid polymer encapsulant 80 or encapsulant film 82. Cover layer 30C of housing 30 may cover strain gauges 26 and light-emitting diodes 28. Layer 30C may contain fabric 14 and/or other flexible materials (e.g., flexible polymer, etc.) and is preferably sufficiently flexible to deform inwardly in direction 84 when outer surface 70 of layer 30C is pressed inwardly by finger 72 of a user. Layer 30C, substrate 64, and support 62 may be interposed between exterior region 58 surrounding device 10 and interior region 60 within device 10. Layer 30C, substrate 64, and support 62 preferably have openings (e.g., gaps between strands 16 in fabric 14 and/or other holes in fabric 14) and/or are otherwise configured to be transparent to light and sound (see, e.g., sound 90 for microphone(s) 22 and/or speaker(s) 24), which may pass between interior 60 and exterior 58 through layer 30C, substrate 64, and support 62). Sound may also pass out of device 10 though an opening at the base of housing 30.

In each light-emitting diode 28, a die such as light-emitting diode die 28D is coupled to traces 74 using electrical connections 78 (e.g., solder connections). Liquid encapsulant 80 and/or encapsulant film 82 may hermetically seal die 28D. Encapsulant 80 and/or film 82 may be sufficiently transparent to allow light 92 to be emitted from diode 28. Light 92 may then pass from the interior side of layer 30C to exterior region 58 through layer 30C.

If desired, light diffusing material, dust-blocking material, additional flexible substrate(s) with electrical components, adhesive and/or coating structures (e.g., reflective coatings such as coatings of white ink, metal, etc.), and/or other layers of material may be located at one or more, two or more, or three or more of the interfaces between the layers of FIG. 7 (e.g., between support 62, substrate 64, and/or cover layer 30C).

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   a speaker configured to produce sound output;
   a substrate;
   strain gauges on the substrate each of which has resistors in a bridge circuit;
   light-emitting diodes on the substrate; and
   a light-transparent and sound-transparent cover layer that covers the strain gauges and the light-emitting diodes, wherein the strain gauges are configured to gather a force measurement on a force applied to the light-transparent and sound-transparent cover layer and wherein the speaker is configured to adjust the sound output in response to the force measurement.

2. The electronic device defined in claim 1 wherein the light-transparent and sound-transparent cover layer comprises fabric and wherein the light-emitting diodes are configured to produce dynamically adjustable illuminated button icons.

3. The electronic device defined in claim 1 wherein the light-emitting diodes are configured to produce a moving light pattern.

4. The electronic device defined in claim 1 wherein the light-emitting diodes comprise colored light-emitting diodes.

5. The electronic device defined in claim 1 wherein the resistors comprise resistors formed from organic resistive layers.

6. The electronic device defined in claim 1 further comprising liquid encapsulant covering the resistors and the light-emitting diodes.

7. The electronic device defined in claim 1 further comprising an encapsulant film covering the resistors and the light-emitting diodes.

8. The electronic device defined in claim 1 further comprising microphones configured to gather microphone input.

9. The electronic device defined in claim 8 wherein the light-emitting diodes are configured to form button icons at a location determined in response to the gathered microphone input.

10. The electronic device defined in claim 9 wherein the light-emitting diodes include colored light-emitting diodes.

11. The electronic device defined in claim 8 wherein the microphone input comprises a voice command and wherein the speaker is configured to provide audio output in response to the voice command.

12. A voice-controlled speaker, comprising:
a microphone configured to gather a voice command;
a speaker configured to provide sound in response to the voice command;
a cover layer through which the sound passes;
a substrate under the cover layer;
strain gauges formed from strain gauge resistors in bridge circuits on the substrate; and
light-emitting diodes on the substrate that are configured to emit light through the cover layer to display a button icon, wherein one of the strain gauges is configured to measure force applied to a portion of the cover layer associated with the button icon.

13. The voice-controlled speaker defined in claim 12 wherein the light-emitting diodes are configured to emit light for additional button icons.

14. The voice-controlled speaker defined in claim 12 wherein the light-emitting diodes are configured to display dynamically reconfigurable icons.

15. The voice-controlled speaker defined in claim 14 wherein the dynamically reconfigurable icons include a volume adjustment button icon overlapping one of the strain gauges and wherein the speaker is configured to adjust a sound level of the sound based on output from the strain gauge overlapped by the volume adjustment button icon.

16. The voice-controlled speaker defined in claim 12 wherein the speaker is configured to adjust a volume level of the sound non-linearly in proportion to a force measured with one of the strain gauges.

17. The voice-controlled speaker defined in claim 12 wherein the speaker is configured to adjust a volume level of the sound in linear proportion to a force measured with one of the strain gauges.

18. The voice-controlled speaker defined in claim 12 wherein the speaker is configured to adjust a volume level of the sound in response to a force measured with one of the strain gauges exceeding a predetermined threshold.

19. A voice-controlled speaker, comprising:
a microphone configured to gather a voice command;
a speaker configured to provide sound in response to the voice command;
a fabric layer that covers the speaker, wherein the sound passes through the fabric layer;
a substrate under the fabric layer;
strain gauges each formed from strain gauge resistors in a bridge circuit on the substrate, wherein the strain gauges are configured to gather force measurements through the fabric layer; and
light-emitting diodes on the substrate that are configured to emit light through the fabric layer, wherein the light-emitting diodes are configured to form dynamically adjustable button icons.

20. The voice-controlled speaker defined in claim 19 wherein a given one of the strain gauges is configured to measure force applied to a portion of the fabric layer associated with a given one of the dynamically adjustable button icons.

* * * * *